(12) United States Patent
Khatri et al.

(10) Patent No.: US 8,515,362 B2
(45) Date of Patent: Aug. 20, 2013

(54) MIXER ARCHITECTURES

(75) Inventors: Himanshu Khatri, La Jolla, CA (US); Li Liu, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 524 days.

(21) Appl. No.: 12/538,775

(22) Filed: Aug. 10, 2009

(65) Prior Publication Data

US 2010/0144290 A1    Jun. 10, 2010

Related U.S. Application Data (60) Provisional application No. 61/109,771, filed on Oct. 30, 2008.

(51) Int. Cl.
   *H04B 1/40*  (2006.01)
(52) U.S. Cl.
   USPC .......................................................... 455/82
(58) Field of Classification Search
   USPC .......................................................... 455/84
   See application file for complete search history.

(56) References Cited

U.S. PATENT DOCUMENTS

| | | | | |
|---|---|---|---|---|
| 4,912,520 | A * | 3/1990 | Yamamoto et al. | 455/333 |
| 6,211,718 | B1 * | 4/2001 | Souetinov | 327/359 |
| 7,099,646 | B1 * | 8/2006 | Jin et al. | 455/313 |
| 2002/0160740 | A1 * | 10/2002 | Hatcher et al. | 455/317 |
| 2008/0278220 | A1 * | 11/2008 | Taylor et al. | 327/535 |

FOREIGN PATENT DOCUMENTS

| | | |
|---|---|---|
| CN | 1526203 A | 9/2004 |
| EP | 0961398 A1 | 12/1999 |
| JP | 63309007 A | 12/1988 |
| JP | 2274106 A | 11/1990 |
| JP | 10209760 A | 8/1998 |
| JP | 11509053 A | 8/1999 |
| JP | 2000013146 | 1/2000 |
| JP | 2003309777 A | 10/2003 |
| JP | 2006173897 A | 6/2006 |
| JP | 2007516624 A | 6/2007 |
| WO | 9641295 A1 | 12/1996 |
| WO | 2005011103 A1 | 2/2005 |
| WO | WO2007068089 A1 | 6/2007 |

OTHER PUBLICATIONS

Multiband UWB Tranceivers IEEE 2005 Custom Integrated Circuits Conference Behzad Razavi, 2005.*
Taiwan Search Report—TW098137052—TIPO—Nov. 2, 2012.

* cited by examiner

*Primary Examiner* — Andrew Wendell
*Assistant Examiner* — David Bilodeau
(74) *Attorney, Agent, or Firm* — Ramin Mobarhan (57) ABSTRACT

Techniques for designing a single-balanced mixer coupled to a dummy portion with a dummy load to improve noise rejection. In an aspect, a single-ended signal (RF) from a stage preceding the mixer, e.g., a low-noise amplifier (LNA), is coupled to the input of the single-balanced mixer to be mixed with a local oscillator (LO) signal. A dummy portion replicating the topology of the single-balanced mixer is coupled to the single-balanced mixer to improve noise rejection, with the LO signal also provided to the dummy portion. The input of the dummy portion may be coupled, e.g., to a dummy load, which is designed to replicate the loading characteristics of the preceding stage, e.g., the LNA.

23 Claims, 8 Drawing Sheets

MIXER ARCHITECTURES

CLAIM OF PRIORITY UNDER 35 U.S.C. §119

The present Application for Patent claims priority to U.S. Provisional Application Ser. No. 61/109,771, filed Oct. 30, 2008, entitled "Receiver using single ended low noise amplifier and single balanced mixer," the disclosure of which is hereby expressly incorporated by reference herein.

BACKGROUND

1. Field

The disclosure relates to integrated circuit (IC) design, and more particularly, to architectures for mixers.

2. Background

Transceivers for wireless communications often incorporate a mixer for up- or down-converting the frequency of a signal. For example, in a communications receiver, a mixer may be coupled to the output of a low-noise amplifier (LNA) to down-convert the output of the LNA by mixing it with a local oscillator (LO) signal.

Various circuit topologies for designing a mixer are well-known in the art. For example, a single-balanced mixer is designed to mix a single-ended input signal with a differential LO signal. One limitation of the single-balanced mixer is that it has relatively poor noise rejection properties compared to other mixer topologies. In comparison, a double-balanced mixer is designed to mix a differential input signal with a differential LO signal. While the double-balanced mixer has relatively good noise rejection properties, it may require the output of the stage preceding the mixer, e.g., an LNA, to be fully differential. A fully differential LNA may consume more power, occupy more die area, and require more IC input pins and/or external matching components than a single-ended LNA. Alternatively, a balun may be provided to transform a single-ended LNA output into a fully differential signal for the double-balanced mixer. However, such a balun may also occupy significant die area, and may introduce insertion loss, which negatively impacts the link budget.

It would be desirable to provide techniques for improving the noise rejection properties of a mixer coupled to a single-ended preceding stage, such as an amplifier.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
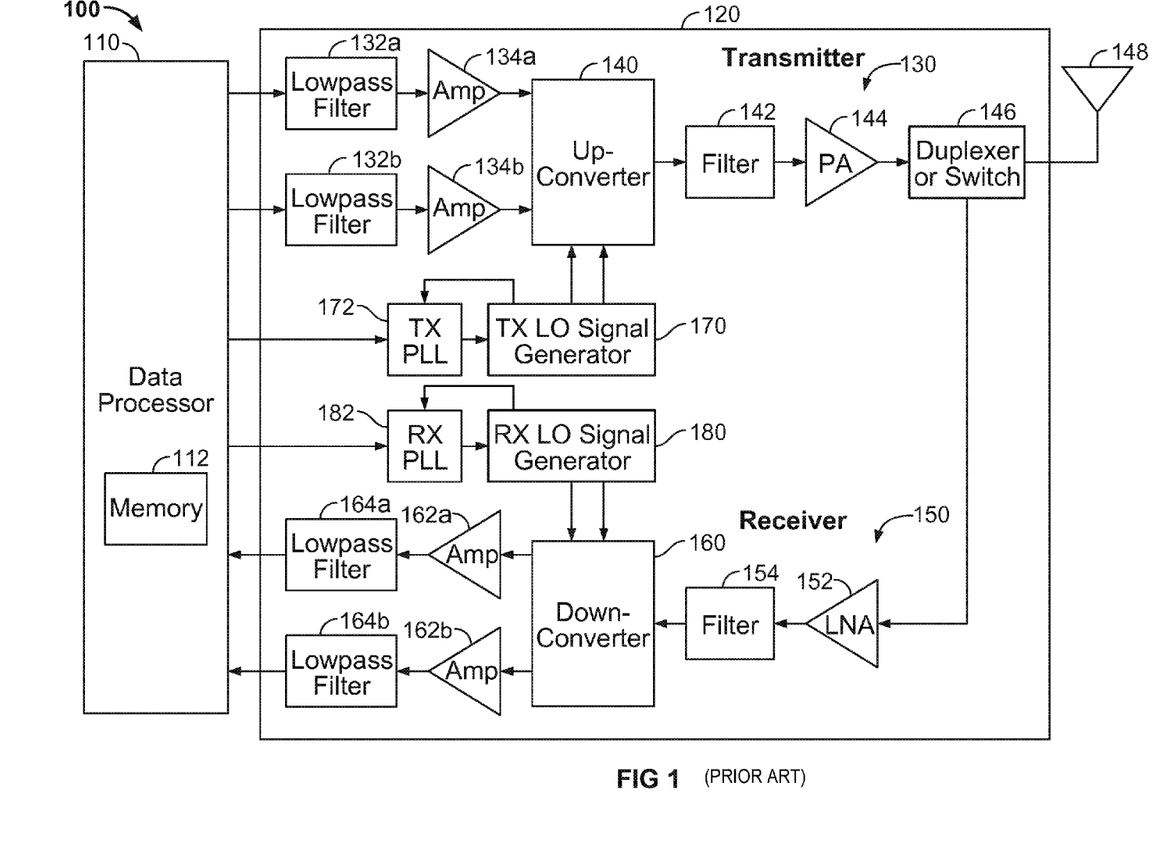
FIG. 1 illustrates a block diagram of a design of a prior art wireless communication device in which the techniques of the present disclosure may be implemented.

FIG. 1 illustrates a block diagram of a design of a prior art wireless communication device 100 in which the techniques of the present disclosure may be implemented. Note the device 100 is shown for illustrative purposes only, and is not meant to restrict the scope of the present disclosure in any way.

In the design shown in FIG. 1, wireless device 100 includes a transceiver 120 and a data processor 110 having a memory 112 to store data and program codes. Transceiver 120 includes a transmitter 130 and a receiver 150 that support bi-directional communication. In general, wireless device 100 may include any number of transmitters and any number of receivers for any number of communication systems and frequency bands.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 1, transmitter 130 and receiver 150 are implemented with the direct-conversion architecture.

In the transmit path, data processor 110 processes data to be transmitted and provides in-phase (I) and quadrature-phase (Q) analog output signals to transmitter 130. Within transmitter 130, lowpass filters 132a and 132b filter the I and Q analog output signals, respectively, to remove undesired images caused by the prior digital-to-analog conversion. Amplifiers (Amp) 134a and 134b amplify the signals from lowpass filters 132a and 132b, respectively, and provide I and Q baseband signals. An up-converter 140 up-converts the I and Q baseband signals with I and Q transmit (TX) local oscillating (LO) signals from a TX LO signal generator 170 and provides an up-converted signal. A filter 142 filters the up-converted signal to remove undesired images caused by the frequency up-conversion as well as noise in a receive frequency band. A power amplifier (PA) 144 amplifies the signal from filter 142 to obtain the desired output power level and provides a transmit RF signal. The transmit RF signal is routed through a duplexer or switch 146 and transmitted via an antenna 148.

In the receive path, antenna 148 receives signals transmitted by base stations and provides a received RF signal, which is routed through duplexer or switch 146 and provided to a low noise amplifier (LNA) 152. The received RF signal is amplified by LNA 152 and filtered by a filter 154 to obtain a desirable RF input signal. A down-converter 160 down-converts the RF input signal with I and Q receive (RX) LO signals from an RX LO signal generator 180 and provides I and Q baseband signals. The I and Q baseband signals are amplified by amplifiers 162a and 162b and further filtered by lowpass filters 164a and 164b to obtain I and Q analog input signals, which are provided to data processor 110.

TX LO signal generator 170 generates the I and Q TX LO signals used for frequency up-conversion. RX LO signal generator 180 generates the I and Q RX LO signals used for frequency down-conversion. Each LO signal is a periodic signal with a particular fundamental frequency. A PLL 172 receives timing information from data processor 110 and generates a control signal used to adjust the frequency and/or phase of the TX LO signals from LO signal generator 170. Similarly, a PLL 182 receives timing information from data processor 110 and generates a control signal used to adjust the frequency and/or phase of the RX LO signals from LO signal generator 180.

FIG. 1 shows an example transceiver design. In general, the conditioning of the signals in a transmitter and a receiver may be performed by one or more stages of amplifier, filter, up-converter, down-converter, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. All or a portion of transceiver 120 may be implemented on one or more analog integrated circuits (ICs), RF ICs (RFICs), mixed-signal ICs, etc.

Figure 2A:
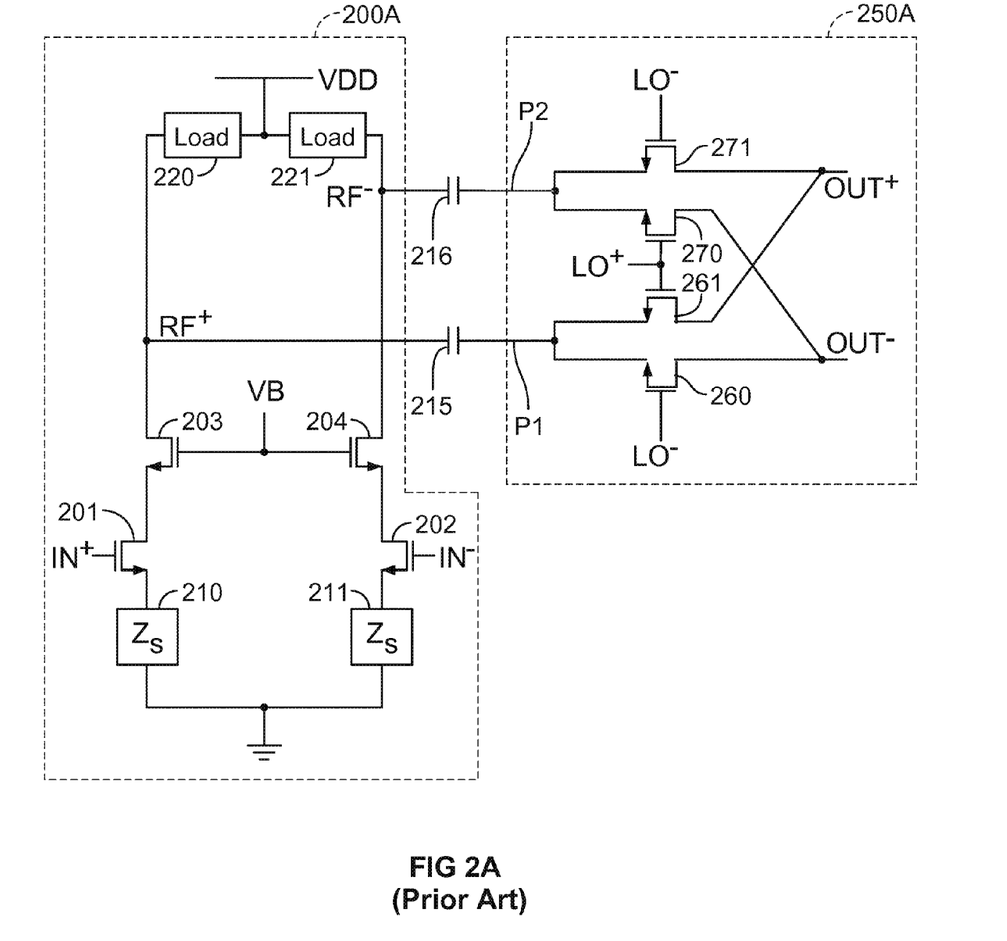
FIG. 2A illustrates a prior art implementation of a differential low-noise amplifier (LNA) coupled to a double-balanced mixer.

FIG. 2A illustrates a prior art implementation of a differential low-noise amplifier (LNA) 200A coupled to a double-balanced mixer 250A. The LNA 200A and mixer 250A may be employed, e.g., in the LNA 152 and down-converter 160 shown in FIG. 1. One of ordinary skill in the art will appreciate that for ease of illustration, certain details have been omitted from the implementation shown, e.g., DC biasing of some of the transistors shown, and provision of an additional mixer or mixers to accommodate a Q-channel in a receiver.

In FIG. 2A, the LNA 200A includes transistors 201, 202, 203, 204 configured in a differential cascode configuration to amplify an input differential voltage (IN$^+$, IN$^-$) to generate an amplified differential voltage (RF$^+$, RF$^-$). Source degeneration impedances 210, 211 are provided for transistors 201, 202, while loads 220, 221 are provided at the drains of transistors 203, 204. A bias voltage VB is provided to the transistors 203, 204.

The amplified RF voltage (RF$^-$, RF$^-$) is coupled to input ports (P1, P2) of the mixer 250A via coupling capacitors 215, 216. The mixer 250A mixes the amplified RF voltage (RF$^+$, RF$^-$) with a differential local oscillator (LO) signal (LO$^+$, LO$^-$) to generate a differential output signal (OUT$^-$, OUT$^-$). The double-balanced mixer 250A includes two pairs of transistors 260, 261 and 270, 271, with the drains of 261 and 271 coupled to each other, and the drains of 260 and 270 coupled to each other. The double-balanced mixer 250A has good noise rejection properties, as noise on either of the LO terminals LO$^+$ or LO$^-$ appears as common-mode noise at the mixer output (OUT$^+$, OUT$^-$), and such common-mode noise is readily rejected by the differential output signal (OUT$^+$, OUT$^-$).

Figure 2B:
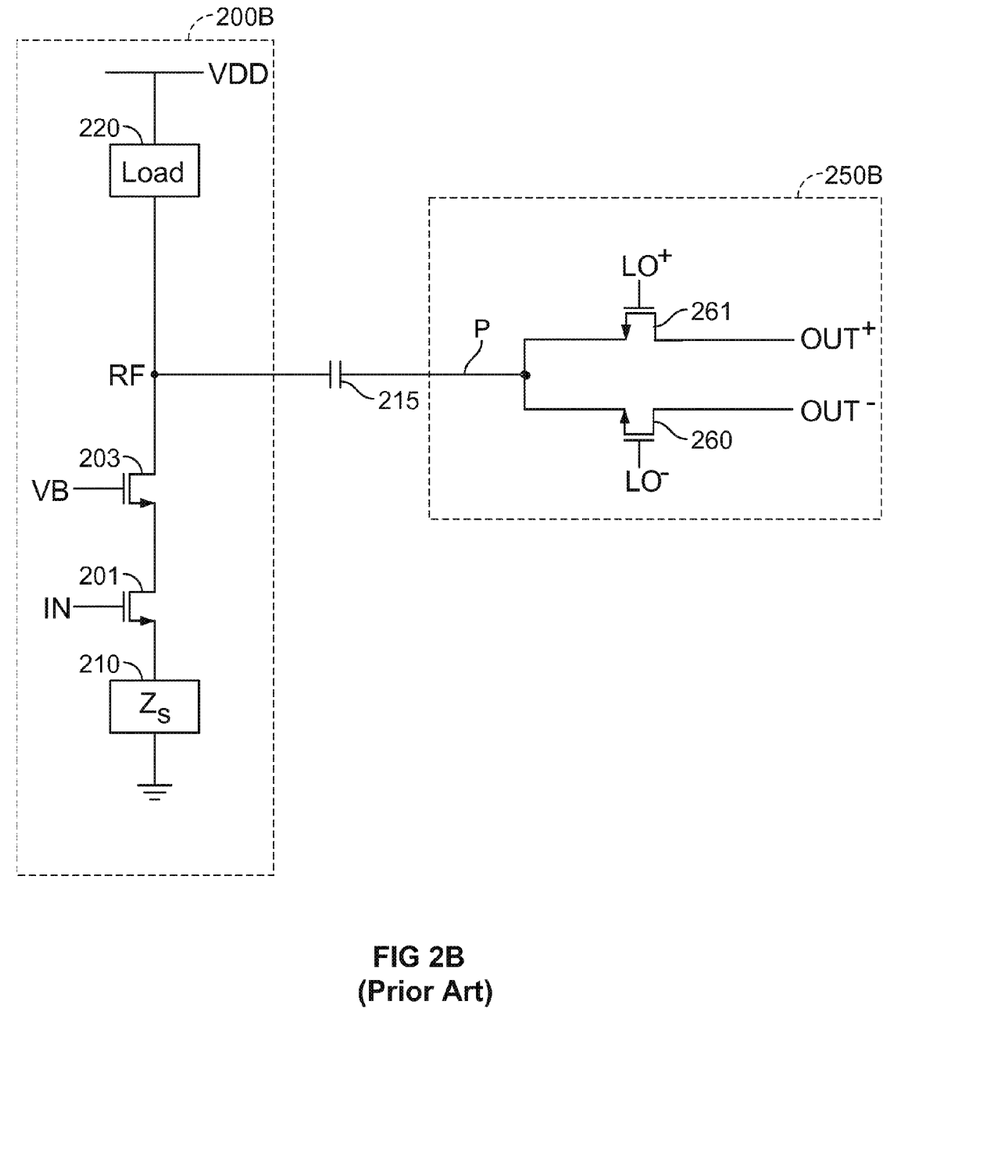
FIG. 2B illustrates a prior art implementation of a single-ended LNA coupled to a single-balanced mixer.

FIG. 2B illustrates a prior art implementation of a single-ended LNA 200B coupled to a single-balanced mixer 250B. In FIG. 2B, the single-ended LNA 200B includes amplifiers 201, 203 configured as a single-ended cascode amplifier to amplify the input voltage (IN) to generate an amplified output voltage (RF). The node supporting the output voltage (RF) is coupled to a single input port (P) of the mixer 250B via a coupling capacitor 215. The mixer 250B mixes the RF signal (RF) with the differential LO signal (LO$^+$, LO$^-$) to generate the output signal (OUT$^+$, OUT$^-$).

One of ordinary skill in the art will appreciate that as the single-ended LNA 200B and single-balanced mixer 250B are implemented with fewer components than the differential LNA 200A and double-balanced mixer 250A, the combination of 200B and 250B may consume less die area on an integrated circuit than the combination of 200A and 250A. However, it will be further appreciated that the output signal (OUT$^+$, OUT$^-$) of the single-balanced mixer 250B may provide relatively poor rejection of LO noise, as noise on either of the LO terminals LO$^+$ or LO$^-$ may appear as differential-mode noise at the mixer output (OUT$^+$, OUT$^-$). In addition, noise from the power supply of the mixer 250B as well as the power supply of the LNA 200B may be directly down-converted to the mixer output (OUT$^+$, OUT$^-$), further degrading the signal-to-noise ratio (SNR).

Figure 3:
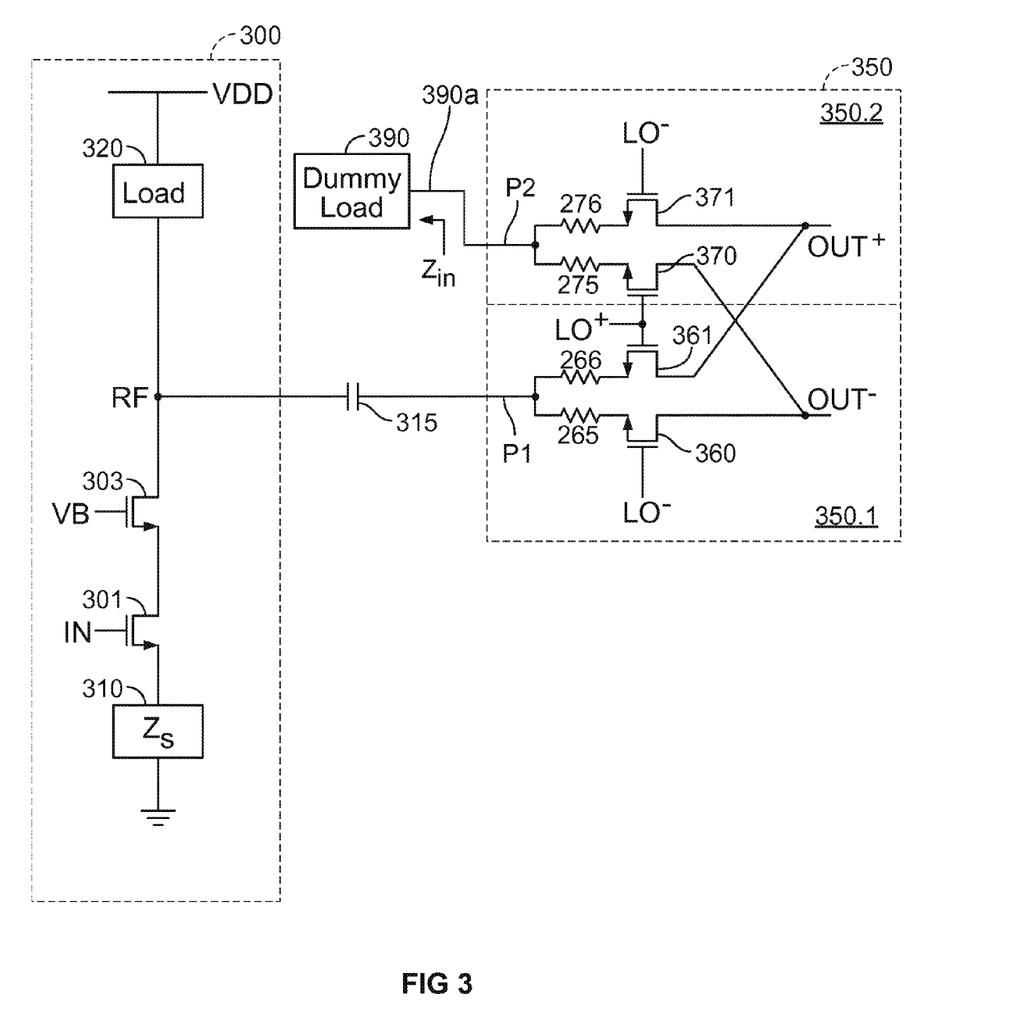
FIG. 3 illustrates an exemplary embodiment of a single-ended LNA coupled to a mixer having a single-balanced portion and a dummy portion according to the present disclosure.

FIG. 3 illustrates an exemplary embodiment of a single-ended LNA 300 coupled to a mixer 350 having a single-balanced portion 350.1 and a dummy portion 350.2 according to the present disclosure. In FIG. 3, the LNA 300 is a single-ended LNA including transistors 301, 303. The LNA output node supporting the voltage (RF) is coupled to a first input port (P1) of the mixer 350 via a coupling capacitor 315. A port (P2) of the dummy portion 350.2 of mixer 350 is coupled to a dummy load 390 at a "dummy load terminal" 390a. By matching the dummy portion 350.2 to the single-balanced portion 350.1 of the mixer 350, the noise rejection properties of a double-balanced mixer may be retained along with the area savings afforded by a single-ended preceding stage such as the LNA 300. Furthermore, by designing the dummy load 390 to have certain characteristics that match those of the single-ended LNA 300, the noise rejection properties of the mixer 350 may be further improved.

In an exemplary embodiment, the dummy load 390 may be designed to have an impedance $Z_{in}$ presented to the second input port (P2) of the mixer 350 that approximates the net impedance presented to the first input port (P1) of the mixer 350 by the LNA 300. Such impedance $Z_{in}$ may account for, e.g., the impedance of the load 320 of the LNA 300, and/or the output impedance of the cascode transistor 303 of the LNA 300. Exemplary embodiments of the dummy load 390 are further described hereinbelow.

In the exemplary embodiment shown, degeneration resistors 265, 266, 275, 276 are provided at the sources of the transistor 260, 261, 270, 271. It will be appreciated that the resistors added to the mixer input may advantageously help to reduce noise.

Figure 4A:
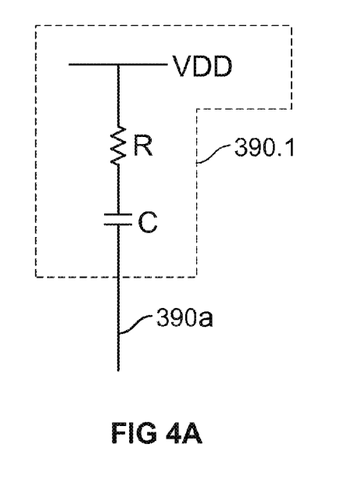
FIGS. 4A, 4B, and 4C illustrate exemplary embodiments of a dummy load according to the present disclosure.

FIG. 4A illustrates an exemplary embodiment 390.1 of a dummy load 390 according to the present disclosure. The dummy load 390.1 includes a series RC connection from the dummy load terminal 390a to VDD. In an exemplary embodiment, the capacitance C of the dummy load 390.1 may be designed to replicate the effects of the coupling capacitor 315 in FIG. 3, as well as any other capacitive (e.g., parasitic) elements present in the LNA 300. One of ordinary skill in the art will appreciate that as a parallel inductor-capacitor (LC) network (not shown) in the load 320 may appear resistive in the desired RF frequency band of operation during resonance, the resistance R of the dummy load 390.1 may be chosen such that it emulates the resistance of such a load 320 during resonance.

Figure 4B:
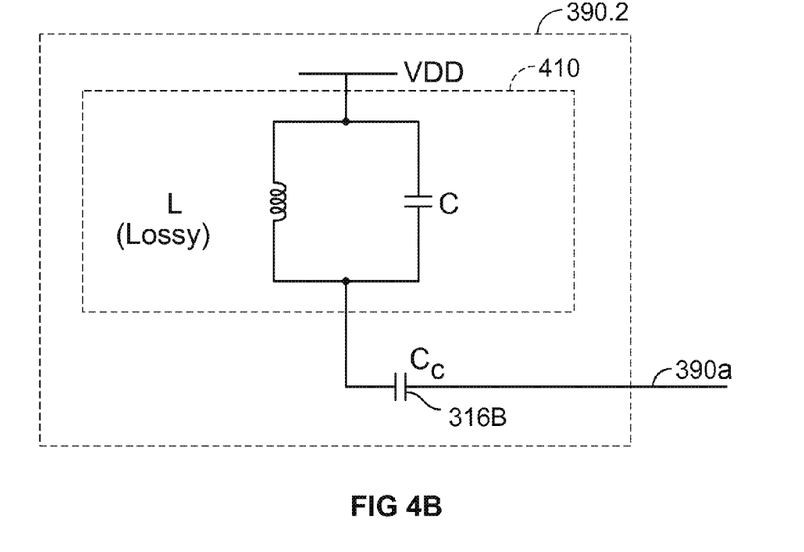

FIG. 4B illustrates an alternative exemplary embodiment 390.2 of a dummy load 390 according to the present disclosure. The dummy load 390.2 includes a parallel LC network 410 coupled in series with a capacitor 316B matched to the coupling capacitor 315 in FIG. 3. In an exemplary embodiment, the LC network 410 may be designed to match an LC network (not shown) in the load 320 of the LNA 300. One of ordinary skill in the art will appreciate that the dummy load 390.2 may advantageously provide better matching to the load 320 over a broader frequency range than compared to the dummy load 390.1, but at the expense of greater die area. In an exemplary embodiment, the inductor within the LC network 410 may be designed to be lossier than a corresponding inductor of an LC network in the load 320, thereby making the die area required to implement the dummy load 390 less than that required for the load 320.

Figure 4C:
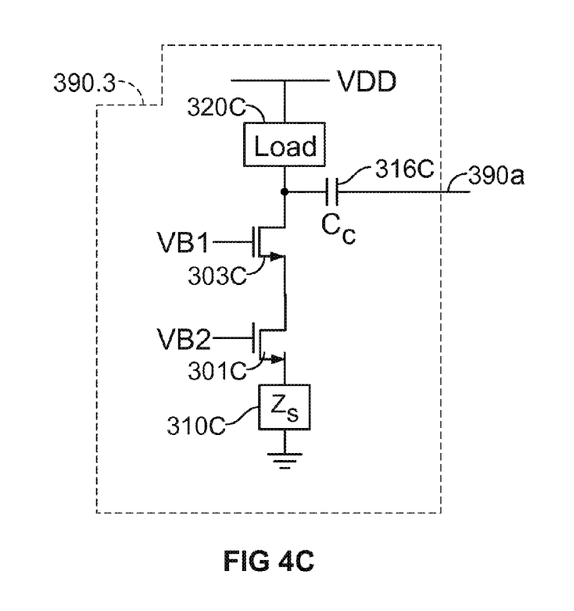

FIG. 4C illustrates yet another exemplary embodiment 390.3 of a dummy load 390 according to the present disclosure. The dummy load 390.3 is designed to replicate the topology and components of the single-ended LNA 300. Note transistors 303C and 301C in the dummy load 390.3 may be biased by voltages VB1 and VB2, respectively. It will be appreciated that providing the dummy load 390.3 advantageously balances the inputs to the mixer 350, while retaining the aforementioned advantages of a single-ended LNA design for the stage preceding the mixer 350.

In an exemplary embodiment, the RC circuit of the dummy load 390.1 may be connected to the same supply voltage VDD that is used to supply the LNA 300. One of ordinary skill in the art will appreciate, however, that in general the dummy load 390 need not be connected to VDD, and may alternatively be connected to any node (e.g., to ground). In yet another exemplary embodiment of a dummy load 390 (not shown), it will be appreciated that the dummy load 390 may simply include a direct connection to high-frequency ground, and need not include any passive components. Such alternative exemplary embodiments are contemplated to be within the scope of the present disclosure.

One of ordinary skill in the art will appreciate that alternative exemplary embodiments of the dummy load 390 not explicitly shown may be readily derived, and that such alternative exemplary embodiments are contemplated to be within the scope of the present disclosure.

Figure 5:
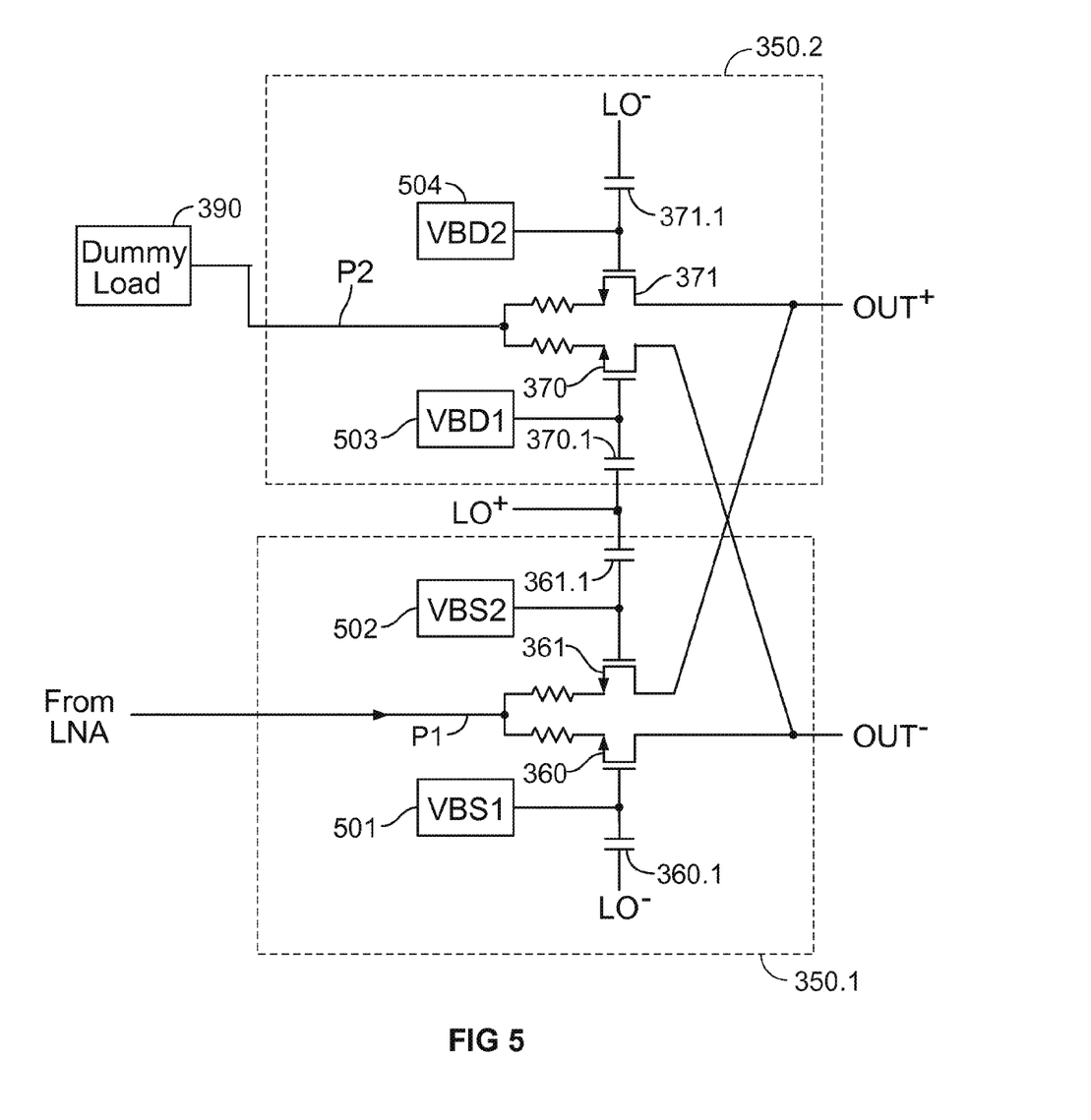
FIG. 5 illustrates an exemplary embodiment of a biasing scheme for transistors of the mixer of FIG. 3.

In an exemplary embodiment, transistors 370, 371 of the dummy portion 350.2 of mixer 350 may be provided with configurable bias voltages to improve the matching between the dummy portion 350.2 and the single-ended portion 350.1. FIG. 5 illustrates an exemplary embodiment of a biasing scheme for transistors 360, 361, 370, 371 of the mixer 350. In FIG. 5, the LO signal (LO+, LO−) is coupled to the transistors 360, 361, 370, 371 using coupling capacitors 360.1, 361.1, 370.1, 371.1, respectively. Transistors 360, 361 of the single-ended portion 350.1 are biased using bias voltages VBS1 501, VBS2 502, while transistors 370, 371 of the dummy portion 350.2 are biased using bias voltages VBD1 503, VBD2 504. In an exemplary embodiment, any or all of the bias voltages VBS1 501, VBS2 502, VBD1 503, and VBD2 504 may be made configurable, and/or calibrated to provide optimal matching of the dummy portion 350.2 to the single-ended portion 350.1.

Figure 6:
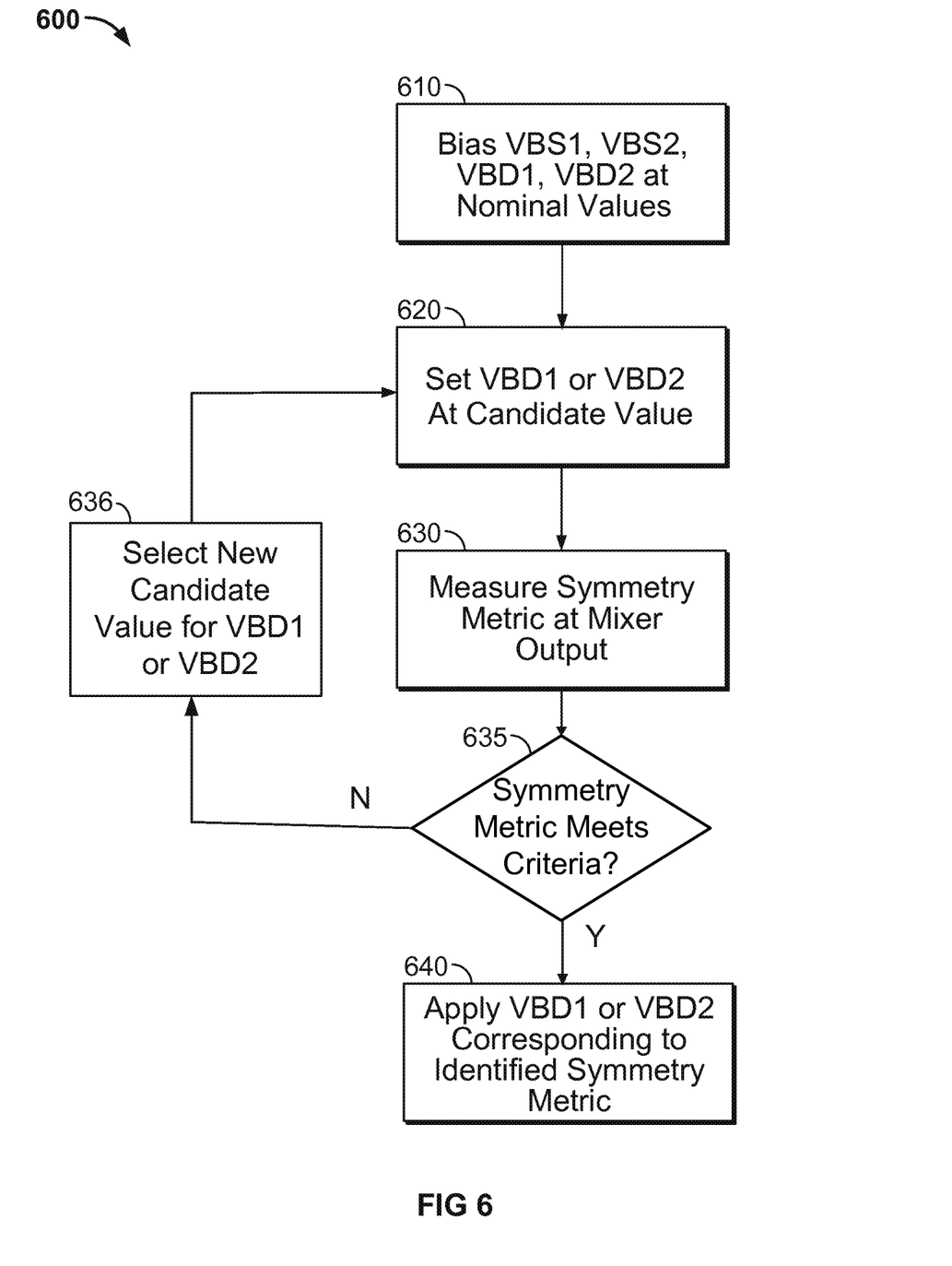
FIG. 6 illustrates an exemplary embodiment of a calibration procedure for optimally selecting the bias voltages VBD1 and VBD2 according to the present disclosure.

FIG. 6 illustrates an exemplary embodiment 600 of a calibration procedure for optimally selecting a bias voltage VBD1 503 or VBD2 504 according to the present disclosure. Note the procedure 600 is provided for illustrative purposes only, and is not meant to limit the scope of the present disclosure to any particular procedure shown. One of ordinary skill in the art will appreciate that alternative procedures (not shown) may additionally or alternatively provide for the adjustment of other sets of bias voltages, e.g., VBS1 501 and VBS2 502, or VDB1 503 and VBD2 in conjunction, and such alternative exemplary embodiments are contemplated to be within the scope of the present disclosure.

In FIG. 6, at block 610, the bias voltages VBS1 501, VBS2 502, VBD1 503, and VBD2 504 are initialized to a set of nominal values to bias the transistors 360, 361, 370, 371. In an exemplary embodiment, such nominal values may be determined, e.g., through computer circuit simulation of the mixer design prior to IC fabrication. The nominal bias values may be stored in a memory (not shown) for retrieval when block 610 is executed during circuit operation.

At block 620, a candidate value for VBD1 503 or VBD2 504 is applied to bias transistor 370 or 371.

At block 630, a symmetry metric corresponding to the candidate value of VBD1 503 or VBD2 504 applied at block 620 is measured at the output of the mixer. In an exemplary embodiment of the techniques herein in a receive (RX) chain, such a symmetry metric may measure, e.g., noise power, noise figure, LO leakage, DC offset, second-order input intercept point (IIP2), etc., and/or any other metric for measuring mixer symmetry not explicitly enumerated herein. In an exemplary embodiment of the techniques herein in a transmit (TX) chain, such a symmetry metric may measure, e.g., residual sideband power at the mixer output.

At block 635, it is checked whether the symmetry metric meets certain predefined criteria. If so, the procedure proceeds to block 640. Otherwise, the procedure proceeds to block 636 to select a new candidate value for VBD1 503 or VBD2 504. Following selection of a new candidate value at block 636, the procedure returns to block 620.

In an exemplary embodiment, the predefined criteria at block 635 may include comparing the symmetry metric to a threshold value to determine whether the applied candidate value of VBD1 503 or VBD2 504 results in an acceptable level of performance at the mixer output. For example, the noise figure may be used as the symmetry metric, and the measured noise figure may be compared to a maximum acceptable noise figure threshold. One of ordinary skill in the art will appreciate that alternative exemplary embodiments utilizing other symmetry metrics may accordingly utilize other predefined criteria at block 635. Such alternative exemplary embodiments are contemplated to be within the scope of the present disclosure.

At block 640, the value of VBD1 503 or VBD2 504 corresponding to the identified symmetry metric measured is applied to bias transistor 370 or 371.

While an exemplary embodiment 600 of a procedure for adjusting the bias voltages VBD1 503 or VBD2 504 has been described with reference to FIG. 6, one of ordinary skill in the art may readily derive other schemes for adjusting the bias voltages. For example, in an alternative exemplary embodiment (not shown), VBD1 503 and VBD2 504 may be varied in conjunction, and furthermore in conjunction with the voltages VBS1 501 and VBS2 502, to obtain an optimal set of bias voltages for each of the transistors 360, 361, 370, 371 in the mixer 350. Such alternative exemplary embodiments are contemplated to be within the scope of the present disclosure.

Figure 7:
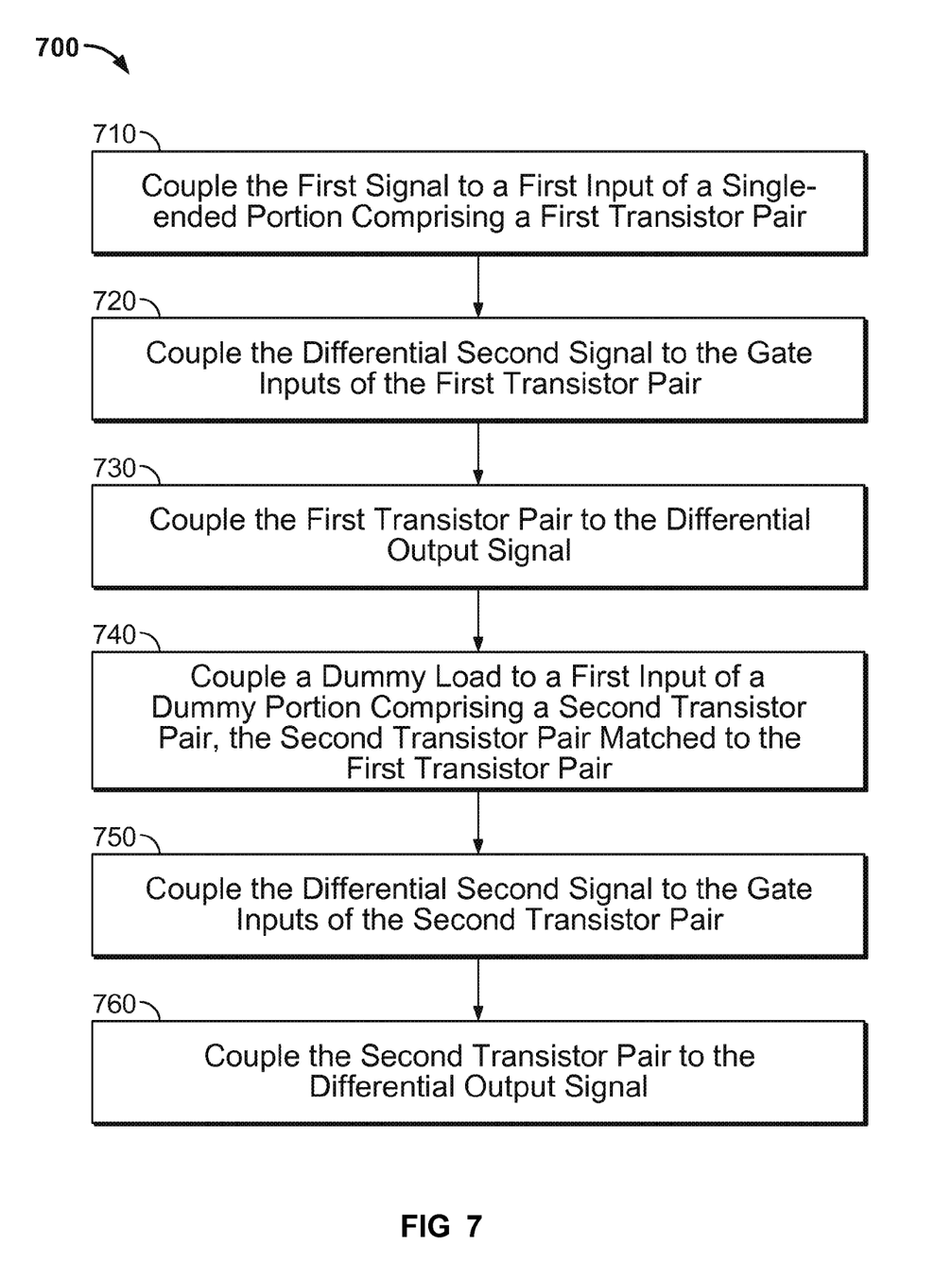
FIG. 7 illustrates an exemplary embodiment of a method according to the present disclosure.

FIG. 7 illustrates an exemplary embodiment of a method 700 according to the present disclosure. Note the method 700 is provided for illustrative purposes only, and is not meant to restrict the scope of the present disclosure to any particular method shown. The method 700 is for mixing a single-ended first signal with a differential second signal to generate a differential output signal.

In FIG. 7, at block 710, the first signal is coupled to a first input of a single-ended portion comprising a first transistor pair.

At block 720, the differential second signal is coupled to the gate inputs of the first transistor pair.

At block 730, the first transistor pair is coupled to the differential output signal.

At block 740, a dummy load is coupled to a first input of a dummy portion comprising a second transistor pair, the second transistor pair being matched to the first transistor pair.

At block 750, the differential second signal is coupled to the gate inputs of the second transistor pair.

At block 760, the second transistor pair is coupled to the differential output signal.

While various exemplary embodiments of the present disclosure have been described in the context of a mixer used for down-conversion in a receiver, one of ordinary skill in the art will appreciate that the techniques need not be applied in such a context. For example, the techniques herein may be adopted in a mixer for a transmitter (not shown), wherein a single-ended baseband signal may be mixed with an LO signal for up-conversion, and the mixer may be provided with a dummy portion and a dummy load as previously described herein. In such an exemplary embodiment, a dummy load may be provided at the output of an up-conversion mixer. This may advantageously allow an up-conversion mixer to directly drive a single-ended driver amplifier, thereby eliminating the need for an intermediate balun in the up-conversion signal path. Such alternative exemplary embodiments are contemplated to be within the scope of the present disclosure.

One of ordinary skill in the art will appreciate that while exemplary embodiments of the present disclosure have been described with reference to MOS transistors (MOSFET's), the techniques of the present disclosure need not be limited to MOSFET-based designs, and may be readily applied to alternative exemplary embodiments (not shown) employing bipolar junction transistors (or BJT's) and/or other three-terminal transconductance devices. For example, in an exemplary embodiment (not shown), any of the comparators shown may utilize BJT's rather than MOSFET's, with the collectors, bases, and emitters of the BJT's coupled as shown for the drains, gates, and sources, respectively, of the MOSFET's. Alternatively, in BiCMOS processes, a combination of both CMOS and bipolar structures/devices may be employed to maximize the circuit performance. Furthermore, unless otherwise noted, in this specification and in the claims, the terms "drain," "gate," and "source" may encompass both the conventional meanings of those terms associated with MOSFET's, as well as the corresponding nodes of other three-terminal transconductance devices, such as BJT's, which correspondence will be evident to one of ordinary skill in the art of circuit design.

One of ordinary skill in the art will further appreciate that while exemplary embodiments of the present disclosure have been described with reference to NMOS devices being used as active devices in the circuitry shown, alternative exemplary embodiments may employ PMOS devices in place of NMOS devices, and vice versa. Such alternative exemplary embodiments are contemplated to be within the scope of the present disclosure.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. An apparatus for mixing a single-ended first signal with a differential second signal to generate a differential output signal, the apparatus comprising:
a single-ended portion comprising a first transistor pair, a first input of the first transistor pair coupled to the single-ended first signal, the gate inputs of the first transistor pair coupled to the differential second signal, the first transistor pair coupled to the differential output signal, wherein the first transistor pair is configured to have no bias current; and
a dummy portion comprising a second transistor pair matched to the first transistor pair, a first input of the second transistor pair coupled to a dummy load terminal, the gates of the second transistor pair coupled to the differential second signal, the second transistor pair coupled to the differential output signal.

2. The apparatus of claim 1, the dummy load terminal being coupled to a high-frequency ground voltage.

3. The apparatus of claim 1, the apparatus further comprising a dummy load coupled to the dummy load terminal.

4. The apparatus of claim 1, the first input of the first transistor pair coupled to the single-ended first signal via degeneration resistors, and the first input of the second transistor pair coupled to the dummy load terminal via degeneration resistors.

5. The apparatus of claim 3, the first input of the first transistor pair coupled to the single-ended first signal via a coupling capacitor, the dummy load further comprising a capacitor.

6. The apparatus of claim 3, further comprising:
an amplifier configured to amplify an input signal to generate the single-ended first signal.

7. The apparatus of claim 6, the dummy load further comprising a capacitor coupled to a resistor coupled to a source voltage.

8. The apparatus of claim 6, the amplifier comprising a parallel inductor-capacitor load, the dummy load further comprising a parallel inductor-capacitor load.

9. The apparatus of claim 8, the inductor of the dummy load designed to be lossier than the inductor of the amplifier load.

10. The apparatus of claim 6, the amplifier comprising:
a cascode amplifier comprising first and second cascode transistors;
a source degeneration impedance coupled to the source of the first cascode transistor; and
a load coupled to the drain of the second cascode transistor;
the dummy load further comprising:
first and second dummy cascode transistors;
a dummy source degeneration impedance coupled to the source of the first dummy cascode transistor; and
a secondary dummy load coupled to the drain of the second dummy cascode transistor.

11. The apparatus of claim 1, the first transistor pair comprising first and second transistors, the second transistor pair comprising third and fourth transistors, a first end of the differential second signal coupled to the gates of the first and fourth transistors, a second end of the differential second signal coupled to the gates of the second and third transistors, the drains of the first and third transistors coupled together, and the drains of the second and fourth transistors coupled together.

12. The apparatus of claim 1, the second signal comprising a local oscillator (LO) signal, the first signal comprising an amplified radio-frequency (RF) signal.

13. The apparatus of claim 1, the second transistor pair being biased by at least one configurable bias voltage.

14. The apparatus of claim 13, the at least one configurable bias voltage being generated by a means for determining a bias voltage to optimize a symmetry metric measured at the output of the mixer.

15. A method for mixing a single-ended first signal with a differential second signal to generate a differential output signal, the method comprising:
coupling the first signal to a first input of a single-ended portion comprising a first transistor pair;
coupling the differential second signal to the gate inputs of the first transistor pair;
coupling the first transistor pair to the differential output signal; and
coupling a dummy load terminal to a first input of a dummy portion comprising a second transistor pair, the second transistor pair matched to the first transistor pair;
coupling the differential second signal to the gate inputs of the second transistor pair; and
coupling the second transistor pair to the differential output signal;
wherein the first transistor pair is configured to have no bias current.

16. The method of claim 15, further comprising coupling a dummy load to the dummy load terminal.

17. The method of claim 15, further comprising coupling the first input of the first transistor pair to the single-ended first signal via degeneration resistors, and coupling the first input of the second transistor pair to the dummy load terminal via degeneration resistors.

18. The method of claim 15, further comprising:
amplifying an input signal to generate the single-ended first signal.

19. The method of claim 15, the second signal comprising a local oscillator (LO) signal, the first signal comprising an amplified radio-frequency (RF) signal.

20. The method of claim 15, further comprising biasing at least one transistor of the first and second transistor pairs using a configurable bias voltage.

21. The method of claim 20, further comprising:
biasing the transistors of the first and second transistor pairs at nominal values;
setting the configurable bias voltage at a value;
measuring a symmetry metric at the differential output signal;
checking whether the symmetry metric meets predetermined criteria;
if the symmetry metric meets predetermined criteria, setting the configurable bias voltage at the value corresponding to the symmetry metric meeting the predetermined criteria; and
if the symmetry metric does not meet predetermined criteria, setting the configurable bias voltage at a new value.

22. The method of claim 21, the symmetry metric comprising a noise figure, the predetermined criteria comprising whether the noise figure is less than a threshold.

23. A non-transitory computer-readable medium storing code for causing a computer to select a bias voltage for a mixer, the code comprising:
code for causing a computer to bias the transistors of a mixer at nominal values, the mixer comprising a single-balanced portion and a dummy portion, the mixer configured to have no bias current;
code for causing a computer to set the configurable bias voltage at a value;
code for causing a computer to measure a symmetry metric at the differential output signal;
code for causing a computer to check whether the symmetry metric meets predetermined criteria;
code for causing a computer to, if the symmetry metric meets predetermined criteria, set the configurable bias voltage at the value corresponding to the symmetry metric meeting the predetermined criteria; and
code for causing a computer to, if the symmetry metric does not meet predetermined criteria, set the configurable bias voltage at a new value.

* * * * *